US007286963B2

(12) United States Patent
Saha et al.

(10) Patent No.: US 7,286,963 B2
(45) Date of Patent: Oct. 23, 2007

(54) METHOD AND DEVICE FOR FAULT LOCATION ON THREE TERMINAL POWER LINE

(75) Inventors: Murari Mohan Saha, Vasteras (SE); Eugeniusz Rosolowski, Wroclaw (PL); Jan Izykowski, Wroclaw (PL); Rafal Molag, Swidnica (PL)

(73) Assignee: ABB Technology Ltd., Zürich (CH)

( * ) Notice: Subject to any disclaimer, the term of this patent is extended or adjusted under 35 U.S.C. 154(b) by 0 days.

(21) Appl. No.: 11/320,835

(22) Filed: Dec. 30, 2005

(65) Prior Publication Data

US 2007/0156358 A1 Jul. 5, 2007

(51) Int. Cl.
*G01R 31/00* (2006.01)

(52) U.S. Cl. .......................... 702/182; 702/58; 702/59; 702/60; 324/512; 324/522; 324/525

(58) Field of Classification Search ................ 702/182, 702/58, 59, 60; 324/512, 522, 525
See application file for complete search history.

(56) References Cited

U.S. PATENT DOCUMENTS

| | | | | |
|---|---|---|---|---|
| 4,559,491 A * | 12/1985 | Saha | .......................... | 324/522 |
| 4,719,580 A * | 1/1988 | Nimmersjo | .................. | 702/59 |
| 4,797,805 A * | 1/1989 | Nimmersjo | .................. | 702/59 |
| 5,600,248 A * | 2/1997 | Westrom et al. | ............ | 324/522 |
| 5,661,664 A * | 8/1997 | Novosel et al. | ............. | 700/293 |
| 5,773,980 A * | 6/1998 | Yang | .......................... | 324/525 |
| 5,825,189 A * | 10/1998 | Johns | ......................... | 324/525 |
| 5,929,642 A * | 7/1999 | Philippot et al. | ........... | 324/522 |
| 6,256,592 B1 * | 7/2001 | Roberts et al. | ............... | 702/59 |
| 6,466,030 B2 * | 10/2002 | Hu et al. | .................... | 324/522 |
| 6,466,031 B1 * | 10/2002 | Hu et al. | .................... | 324/522 |
| 2006/0097728 A1 * | 5/2006 | Saha et al. | .................. | 324/525 |
| 2006/0142964 A1 * | 6/2006 | Saha et al. | .................... | 702/66 |

OTHER PUBLICATIONS

Ying-Hong Lin et al.; A new Fault Locator for Three-Terminal Transmission Lines—Using Two-terminal Synchronized Voltage and Current Phasors; IEEE Transactions on Power Delivery; vol. 17, No. 2; Apr. 2002; pp. 452-459.

Adly A. Girhis et al; A New Fault Location Technique for Two-and Three-Terminal Lines; Transactions on Power Delivery, vol. 7, No. 1 , Jan. 1992; pp. 98-107.

R.K. Aggarwal et al.; Computer-Aided Design and Testing of an Accurate Fault Locator for EHV Teed Feeders; Proc. 1993 International Conference on DPSP, York, 1993, pp. 60-64.

Sukumar M. Brahma; Fault Location Scheme for a Multi-Terminal Transmission Line Using Synchronized Voltage Measurements; IEEE Transactions on Power Delivery, vol. 20, No. 2, Apr. 2005; pp. 1325-1331.

J.F. Minambres et al.; A new technique, based on voltages, for fault location on three-terminal transmission lines; Electric Power Systems Research 37; 1996; pp. 143-151.

* cited by examiner

*Primary Examiner*—Carol S. W. Tsai
(74) *Attorney, Agent, or Firm*—Venable LLP; Eric J. Franklin

(57) ABSTRACT

A method for locating a fault in three terminal power line, having sections located in front of or behind of the tap point and which assumes occurrence of the fault in at least one of those sections. Three phase currents and voltages are measured at one end of the power lines system. The amplitudes of load currents in the remaining sections of the power lines system are measured before a fault occurs. The measurements of the amplitudes of load currents are stored in the remaining sections of the power lines system. Impedance data of the network are determined. The symmetrical components approach is used when calculating the location of the fault.

21 Claims, 5 Drawing Sheets

METHOD AND DEVICE FOR FAULT LOCATION ON THREE TERMINAL POWER LINE

TECHNICAL FIELD

This invention relates to a method and a device for locating a fault location within a section of a three-phase power transmission system having three terminals and by using only limited measurements.

BACKGROUND OF THE INVENTION

Power transmission lines carry electric power from generating sources to users. The power transmission lines are typically high voltage lines and the electric voltage is typically transformed down to a lower voltage at a power substation, before being distributed to individual electric power users such as homes, business buildings etc. At many power substations, protective relays are included.

The detection of a fault involves measuring critical system parameters and, when a fault occurs, quickly making a rough estimate of the fault location and of certain characteristics of the fault so that the faulted line can be isolated from the power grid as quick as possible. A fault occurs when a transmission line, typically due to external causes, diverts electrical current flow from its normal path along the transmission line.

The major types and causes of faults are insulation faults, caused by design defects, manufacturing defects, improper installation, and aging insulation; electrical faults, caused by lightning surges, switching surges, and dynamic overvoltages; mechanical faults, caused by wind, snow, ice, contamination, trees, and animals; and thermal faults, caused by overcurrent and overvoltage conditions.

A transmission line typically includes three phase lines, however, a transmission line may also contain one phase, or some other number of phases.

PRIOR ART

The issue of locating faults in three-terminal lines has been considered in the prior art. It is then considered that the vicinity of the three-terminal line is equivalent with three active systems located behind the respective line terminals. In such cases the active systems are in the form of the sources with EMFs (Electro Motive Force) and internal impedances. The arrangement of a three-terminal line with all active sources is treated as the standard in considering the problem of locating faults. If the tap node of the two-terminal line, dividing the line into the sending and receiving side, is used only for supplying, via power transformer, the passive load then such arrangement is also considered as a three-branches network, but with two active branches and one passive branch, see U.S. Pat. No. 6,466,030.

In Girgis (A. A., Hart D. G., Peterson W. L., "A new fault location technique for two-and three-terminal lines", IEEE Trans. Power Delivery, Vol. 7, No. 1, pp. 98-107, January 1992) the use of complete measurements of three-phase currents and voltages from all three terminals of the line has been considered for fault location. Both the synchronized and unsynchronized measurements have been considered there.

Similarly, the availability of complete three-terminal measurements has been considered by Aggarwal (Aggarwal R. K., Coury D. V., Johns A. T., Kalam A., "Computer-aided design and testing of accurate fault location for EHV teed feeders", in Proc. 1993 International Conference on DPSP, York, pp. 60-64.)

In the U.S. Pat. No. 6,256,592 the fault location system for application to three-terminal line has been disclosed. It also considers complete measurements at all terminals. However, in order to limit the amount of information, which has to be sent by the communication channels, the following minimal information sent by each relay, the measurements are considered as performed by digital relays installed at all three terminals, to each of the other relays is:

- magnitude and angle of the phasor of the negative sequence current,
- magnitude and angle of the phasor of the calculated negative sequence voltage at the tap node.

Y. Lin et al (Y. Lin, C. Liu, C. Yu, "A new fault locator for three-terminal transmission lines using two-terminal synchronized voltage and current phasors", IEEE Trans. Power Delivery, Vol. 7, No. 3, pp. 452-459, 2002.) has disclosed a fault locator for three-terminal transmission lines using incomplete, i.e. two-terminal synchronized voltages and current phasors.

Yet another limited application of measurements on a three-terminal line has been considered by Minambres (Minambres J. F., Zamora I., Mazon A. J., Zorrozua M. A., Alvarez-Isasi R., "A new technique, based on voltages, for fault location on three-terminal transmission lines", Electric Power Systems Research 37 (1996), pp 143-151) and by Sukumar (Sukumar M. Brahma, "Fault Location Scheme for a Multi-Terminal Transmission Line Using Synchronized Voltage Measurements", IEEE Trans. on Power Delivery, Vol. 20, No. 2, April 2005, pp. 1325-1331.) where the fault location is designed with use only voltages measured at all the terminals.

In U.S. Pat. No. 6,466,030 is disclosed a method for locating faults on a two-terminal line with a single tapped load (the arrangement also constituting of three branches) and the two-terminal unsynchronized voltage and current measurements is applied. The synchronization angle used for providing a common time base for the measurements is calculated with use of the available measurements.

The fault locator disclosed in U.S. Pat. No. 4,559,491 is designated for locating faults only on two-terminal lines. It can be easily extended for application to three-terminal line, however only if the tap of the line is of the form of the branch of the passive nature. In contrast, the presented invention of the fault locator suits for a more general case, i.e. for three-terminal lines having active systems at all the terminals.

SUMMARY OF THE INVENTION

The object of the present invention is to solve the problems related to known methods and prior art, and to create an improved, simple and reliable method and device for locating faults in a three-terminal power line.

In contrast to the approaches presented in the prior art this new method uses very limited number of measurements. It is considered that the fault location on three-terminal line is performed basically with use of three phase currents and voltages acquired at the bus where the fault locator is installed. Additionally, pre-fault flow of currents (pre-fault phasors of currents) in the remote remaining line sections is used. However, determination of this pre-fault flow does not require use of the measurement equipment for phasor measurement. The pre-fault phasors of currents can be determined analytically using the load currents flow programs or, as is proposed, can be calculated with using magnitudes of load currents in the remote sections. Information on magnitudes of load currents is usually available and thus can be included as the fault locator input data.

The important features of the invention is that limited measurements are used compared to earlier known methods. One-ended measurements of currents and voltages and additional information on amplitudes of load (pre-fault) currents from the remaining sections of the line are utilized only. Detailed impedance data of the network has to be provided as the fault locator input data. The method is based on the symmetrical components approach and thus is intended for application to the transposed lines. In case of the untransposed lines the presented algorithm has to be rewritten down using the phase co-ordinates description.

The algorithm considers that at each terminal there is an active system (with generation), however it operates correctly for the case with the passive load at the particular terminal (or terminals). It can be also extended for application to the lines with more terminals. The presented technique can be applied for fault location in distribution feeders in the presence of distribution generation.

BRIEF DESCRIPTION OF THE DRAWINGS

For better understanding of the present invention, reference will be made to the below drawings/figures.

DESCRIPTION OF PREFERRED EMBODIMENTS

It is well known that in order to assure high accuracy for locating faults, the use of communication means for sending the measurement data acquired at different network terminals is applied in modern microprocessor-based fault locators. However, the multi-terminal measurements are not always the case. Even if the multi-terminal measurements are at our disposal, it is advisable that the designed fault locator is equipped with the procedure utilizing basically the one-ended measurements. This since the loss of communication with the remote terminals may occur in reality. Of these reasons the fault location algorithm for a three-terminal line (see FIG. 1) with use of the limited measurements. Use of one-ended measurements of three phase voltages and currents, from the local terminal A, where the fault locator is installed, and additional information on pre-fault flow of currents in the remote sections, is proposed. It has been found that providing amplitudes of pre-fault currents from the other remote terminals (B and C) make possible determination of the pre-fault flow of currents. Impedance data for the whole network has also to be provided as the input parameters of the presented fault location algorithm. Information on fault such as:—fault type,—fault incipience and clearing time is also utilised.

The fault location algorithm comprises three subroutines: SUB_A, SUB_B, SUB_C (see FIG. 1), which are designated for locating faults in particular sections: AT, BT, CT of the line. Depending on the fault type, the respective fault-loops are considered by the all three subroutines.

In order to achieve good accuracy of the fault location the compensation for the reactance effect is incorporated in the subroutines. It is distinctive, that in case of locating faults in the sections LB, LC, which are not adjacent to the main measurement terminal A, the analytical shift of the measurements to the tap point T is applied. After considering these three hypotheses—according to the subroutines: SUB_A, SUB_B, SUB_C, the valid subroutine is selected.

Fault Location—Subroutine: SUB_A

Figure 1:
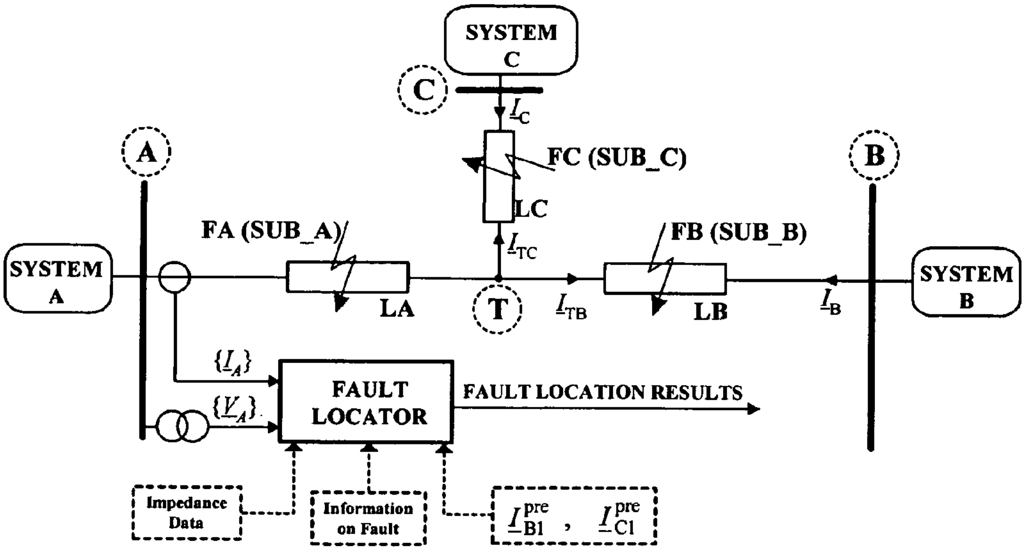
FIG. 1 illustrates a schematic diagram of fault location on three-terminal line with limited measurements

FIG. 1 illustrates a schematic diagram of fault location on three-terminal line with limited measurements. Assuming the hypothesis that a fault happens within the section LA the following generalized fault loop model is formulated:

$$\underline{V}_{Ap} - d_{FA}\underline{Z}_{1LA}\underline{I}_{Ap} - R_{FA}\left(\frac{\underline{\alpha}_{F1}\Delta\underline{I}_{A1}}{\underline{k}_{FA1}} + \frac{\underline{\alpha}_{F2}\underline{I}_{A2}}{\underline{k}_{FA2}} + \frac{\underline{\alpha}_{F0}\underline{I}_{A0}}{\underline{k}_{FA0}}\right) = 0 \tag{1}$$

where:

$d_{FA}$—distance to fault (p.u.), counted at the bus A up to a fault point FA in the line section AT, $R_{FA}$—fault resistance, $\underline{V}_{AP}$, $\underline{I}_{Ap}$—fault loop voltage and current composed according to the fault type—Table I, $\underline{Z}_{lLA}=R_{lLA}+jX_{lLA}$—impedance of the line section AT for the positive sequence, $\Delta\underline{I}_{A1}=\underline{I}_{A1}-\underline{I}_{A1}^{pre}$—incremental (superimposed) positive sequence component of currents from the terminal A, $\underline{I}_{A2}$, $\underline{I}_{A0}$—negative and zero sequence currents from A, $\underline{k}_{FA1}$, $\underline{k}_{FA2}$, $\underline{k}_{FA0}$—fault current distribution factors for the positive, negative, zero sequences, respectively, $\underline{a}_{F1}$, $\underline{a}_{F2}$, $\underline{a}_{F0}$—share coefficients (Table II).

The fault loop signals are further uniformly expressed in terms of the sequence quantities (the last subscript denotes the respective sequence):

$$\underline{V}_{Ap} = \underline{\alpha}_1\underline{V}_{A1} + \underline{\alpha}_2\underline{V}_{A2} + \underline{\alpha}_0\underline{V}_{A0} \tag{2}$$

$$\underline{I}_{Ap} = \underline{\alpha}_1\underline{I}_{A1} + \underline{\alpha}_2\underline{I}_{A2} + \underline{\alpha}_0\frac{\underline{Z}_{0LA}}{\underline{Z}_{1LA}}\underline{I}_{A0} \tag{3}$$

where:

$\underline{a}_1$, $\underline{a}_2$, $\underline{a}_0$—weighting coefficients (Table I).

In general, there is certain freedom in setting the share coefficients. It has been proposed to utilize that for limiting adverse influence of uncertainty with respect to zero sequence impedance data upon the fault location accuracy. Therefore, for further application the set with the share coefficient for the zero sequence equal to zero (Table II) is taken. In consequence, there is a need for considering the flow of currents for the incremental positive and for the negative sequences only (see FIGS. 2 and 3). Note that in FIG. 3 and further on, the negative sequence and the positive sequence impedances are marked identically ($\underline{Z}_{2LA}=\underline{Z}_{1LA}$).

Figure 2:
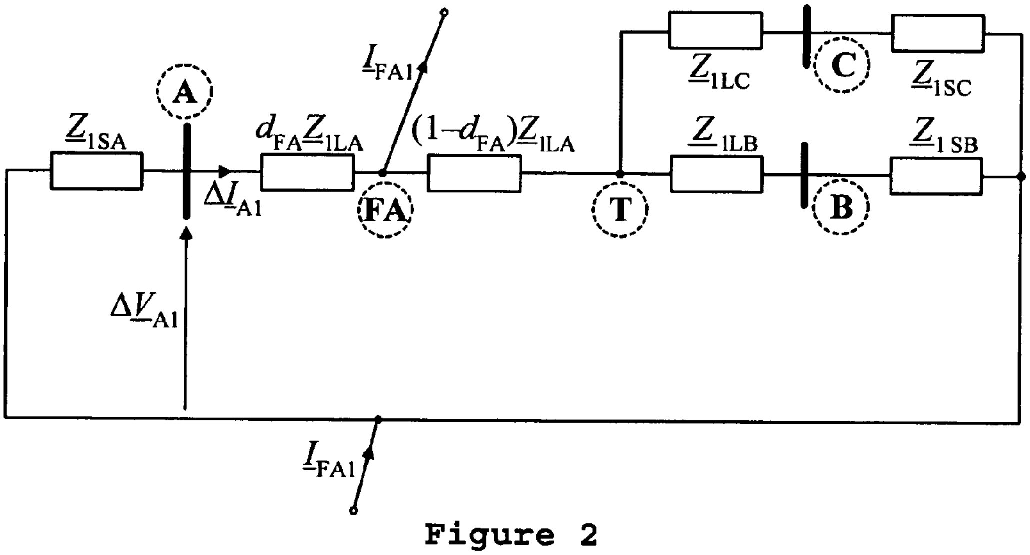
FIG. 2 illustrates a circuit diagram of the network for faults in a section AT, for the incremental positive sequence.

The performed analysis for the circuit of FIG. 2, illustrating an Equivalent circuit diagram of the network for faults in the section AT, for the incremental positive sequence, has yielded the following form of the fault distribution factors for the positive (negative) sequences:

$$\underline{k}_{FA1}=\underline{k}_{FA2}=\frac{\underline{K}_{A1}d_{FA}+\underline{L}_{A1}}{\underline{M}_{A1}}\ \text{where:} \tag{4}$$

$$\underline{K}_{A1}=\underline{Z}_{1LA}$$

$$\underline{L}_{A1}=\frac{(\underline{Z}_{1LB}+\underline{Z}_{1SB})(\underline{Z}_{1LC}+\underline{Z}_{1SC})}{\underline{Z}_{1LB}+\underline{Z}_{1SB}+\underline{Z}_{1LC}+\underline{Z}_{1SC}}+\underline{Z}_{1LA}$$

$$\underline{M}_{A1}=\underline{L}_{A1}+\underline{Z}_{1SA}$$

TABLE I

Weighting Coefficients in Fault Loop Signals (2)-(3)

| Fault type | $\underline{a}_1$ | $\underline{a}_2$ | $\underline{a}_0$ |
|---|---|---|---|
| a-g | 1 | 1 | 1 |
| b-g | $\underline{a}^2$ | $\underline{a}$ | 1 |
| c-g | $\underline{a}$ | $\underline{a}^2$ | 1 |
| a-b<br>a-b-g<br>a-b-c<br>a-b-c-g | $1-\underline{a}^2$ | $1-\underline{a}$ | 0 |
| b-c<br>b-c-g | $\underline{a}^2-\underline{a}$ | $\underline{a}-\underline{a}^2$ | 0 |
| c-a<br>c-a-g | $\underline{a}-1$ | $\underline{a}^2-1$ | 0 |

$\underline{a}=\exp(j2\pi/3)$ $j=\sqrt{-1}$

TABLE II

Chosen set of share coefficients in (1), (6)

| Fault type | $\underline{a}_{F1}$ | $\underline{a}_{F2}$ | $\underline{a}_{F0}$ |
|---|---|---|---|
| a-g | 0 | 3 | 0 |
| b-g | 0 | $3\underline{a}$ | 0 |
| c-g | 0 | $3\underline{a}^2$ | 0 |
| a-b | 0 | $1-\underline{a}$ | 0 |
| b-c | 0 | $\underline{a}-\underline{a}^2$ | 0 |
| c-a | 0 | $\underline{a}^2-1$ | 0 |
| a-b-g<br>a-b-c-g,<br>a-b-c | $1-\underline{a}^2$ | $1-\underline{a}$ | 0 |
| b-c-g | $\underline{a}^2-\underline{a}$ | $\underline{a}-\underline{a}^2$ | 0 |
| c-a-g | $\underline{a}-1$ | $\underline{a}^2-1$ | 0 |

Taking into account the share coefficients from Table II and substituting (4) into (1) results after rearranging in the following quadratic equation for complex numbers:

$$\underline{A}_2d_{FA}^2+\underline{A}_1d_{FA}+\underline{A}_0+\underline{A}_{00}R_{FA}=0 \tag{5}$$

where:

-continued $$\underline{A}_2=\underline{Z}_{1LA}\underline{K}_{A1}$$

$$\underline{A}_1=\underline{Z}_{1LA}\underline{L}_{A1}-\underline{Z}_{Ap}\underline{K}_{A1}$$

$$\underline{A}_0=-\underline{Z}_{Ap}\underline{L}_{A1}$$

$$\underline{A}_{00}=\frac{\underline{M}_{A1}(\underline{a}_{F1}\Delta\underline{I}_{A1}+\underline{a}_{F2}\underline{I}_{A2})}{\underline{I}_{Ap}}$$

$$\underline{Z}_{Ap}=\frac{\underline{V}_{Ap}}{\underline{I}_{Ap}}\ \text{- apparent impedance of the fault loop.}$$

The complex formula (5) can be resolved into the real and imaginary components giving the respective two equations for real numbers. In consequence, it is possible to get the solution for both unknowns: $d_{FA}$—distance to fault (counted from the bus A), $R_{FA}$—fault resistance.

Subroutine: SUB_B

Again, the shunt capacitances of the lines are neglected at this stage. However, in order to improve fault location accuracy they can be accounted for further. In case of the subroutine SUB_B, designated for faults in the section BT, the following generalized fault loop model is formulated:

$$\underline{V}_{Tp}-(1-d_{FB})\underline{Z}_{1LB}\underline{I}_{TBp}-R_{FB}\left(\frac{\underline{a}_{F1}\Delta\underline{I}_{TB1}}{\underline{k}_{FB1}}+\frac{\underline{a}_{F2}\underline{I}_{TB2}}{\underline{k}_{FB2}}\right)=0 \tag{6}$$

where:

Fault loop voltage transferred to the tap point T:

$$\underline{V}_{Tp}=\underline{a}_1\underline{V}_{T1}+\underline{a}_2\underline{V}_{T2}+\underline{a}_0\underline{V}_{T0} \tag{7}$$

Fault loop current transferred to the tap point T (from the side of the section BT—FIG. 1):

$$\underline{I}_{TBp}=\underline{a}_1(\Delta\underline{I}_{TB1}+\underline{I}_{TB1}^{pre})+\underline{a}_2\underline{I}_{TB2}+\underline{a}_0\frac{\underline{Z}_{0LB}}{\underline{Z}_{1LB}}\underline{I}_{TB0} \tag{8}$$

$\underline{a}_1$, $\underline{a}_2$, $\underline{a}_0$—weighting coefficients (Table I)), $\underline{k}_{FB1}$, $\underline{k}_{FB2}$—fault current distribution factors for the positive, negative sequences, respectively, $\underline{a}_{F1}$, $\underline{a}_{F2}$, $\underline{a}_{F0}$—share coefficients (Table II).

Transfer of the fault loop voltage from the bus A to the tap point T can be accomplished as follows:

$$\begin{bmatrix}\underline{V}_{T1}\\ \underline{V}_{T2}\\ \underline{V}_{T0}\end{bmatrix}=\begin{bmatrix}\underline{V}_{A1}\\ \underline{V}_{A2}\\ \underline{V}_{A0}\end{bmatrix}-\begin{bmatrix}\underline{Z}_{1LA}\underline{I}_{A1}\\ \underline{Z}_{1LA}\underline{I}_{A2}\\ \underline{Z}_{0LA}\underline{I}_{A0}\end{bmatrix} \tag{9}$$

In the weighted sum (8) there are symmetrical components of the transferred current. In case of the positive sequence the component is taken as the sum of the incremental positive sequence current $\Delta\underline{I}_{TB1}$ and its pre-fault value $\underline{I}_{TB1}^{pre}$.

The currents: $\Delta\underline{I}_{TB1}$, $\underline{I}_{TB2}$, $\underline{I}_{TB0}$ (incremental positive, negative and zero sequence currents at the transfer point (at the end of the section BT, connected to the tap point T—FIG. 4)) is determined by considering the respective equivalent circuit diagrams. Knowledge of the measured currents: $\Delta\underline{I}_{A1}$, $\underline{I}_{A2}$, $\underline{I}_{A0}$; voltages: $\Delta\underline{V}_{A1}$, $\underline{V}_{A2}$, $\underline{V}_{A0}$ and impedance data of the network are required for that.

Figure 4:
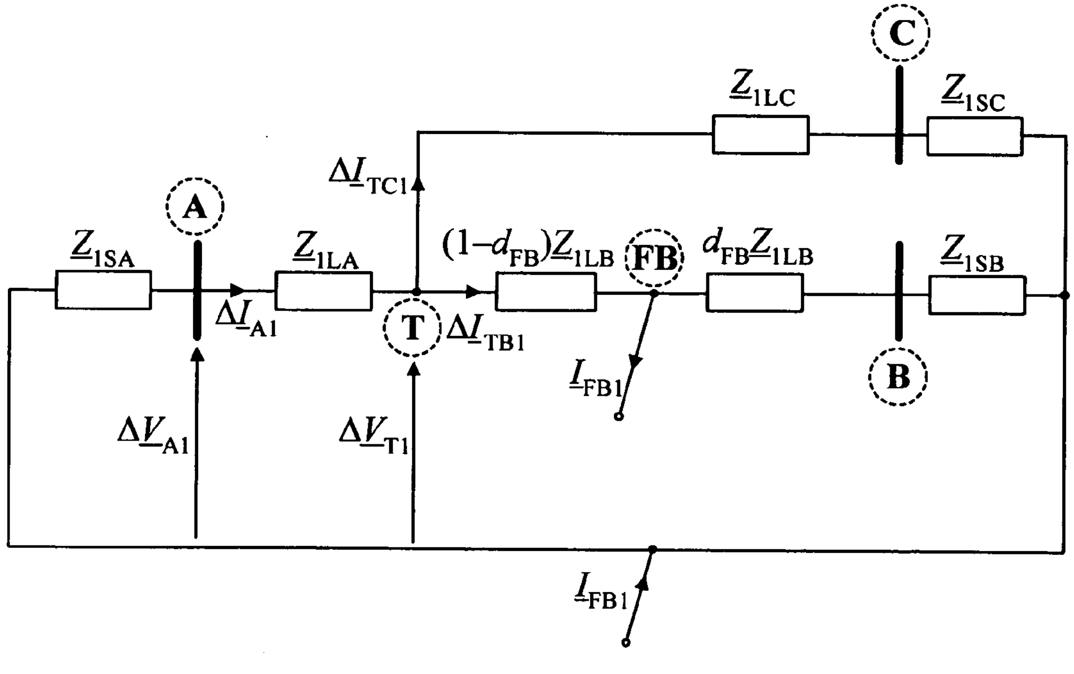
FIG. 4 illustrates an equivalent circuit diagram of the network for faults in the section BT, for the incremental positive sequence.
Figure 5:
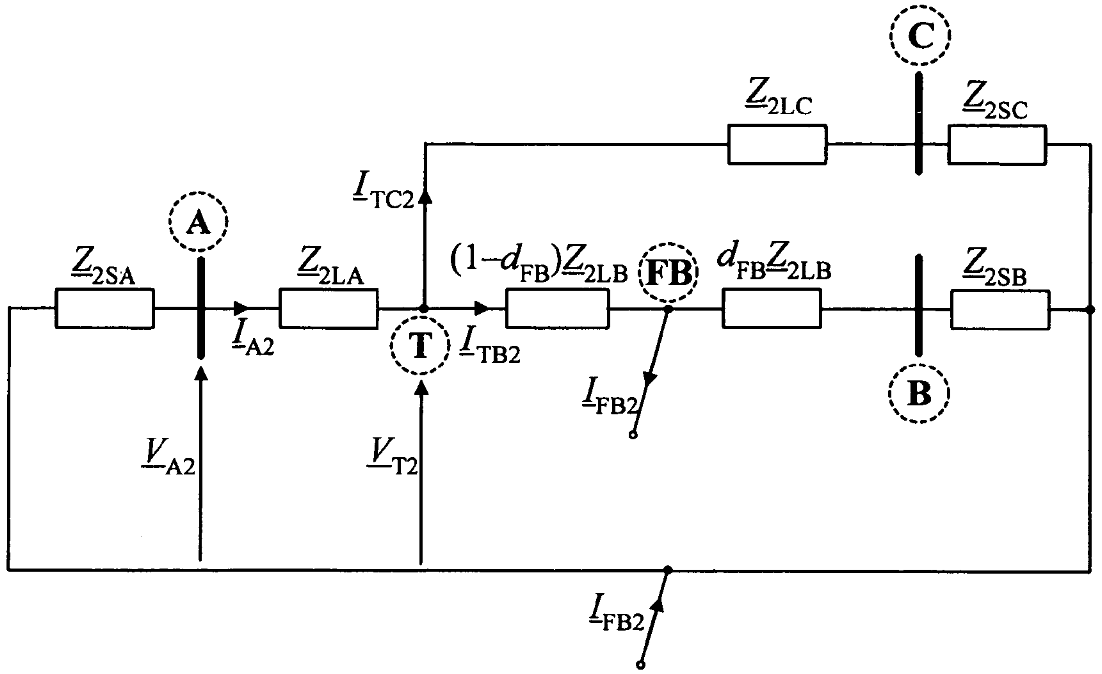
FIG. 5 illustrates an Equivalent circuit diagram of the network for faults in the section BT, for the negative sequence.
Figure 6:
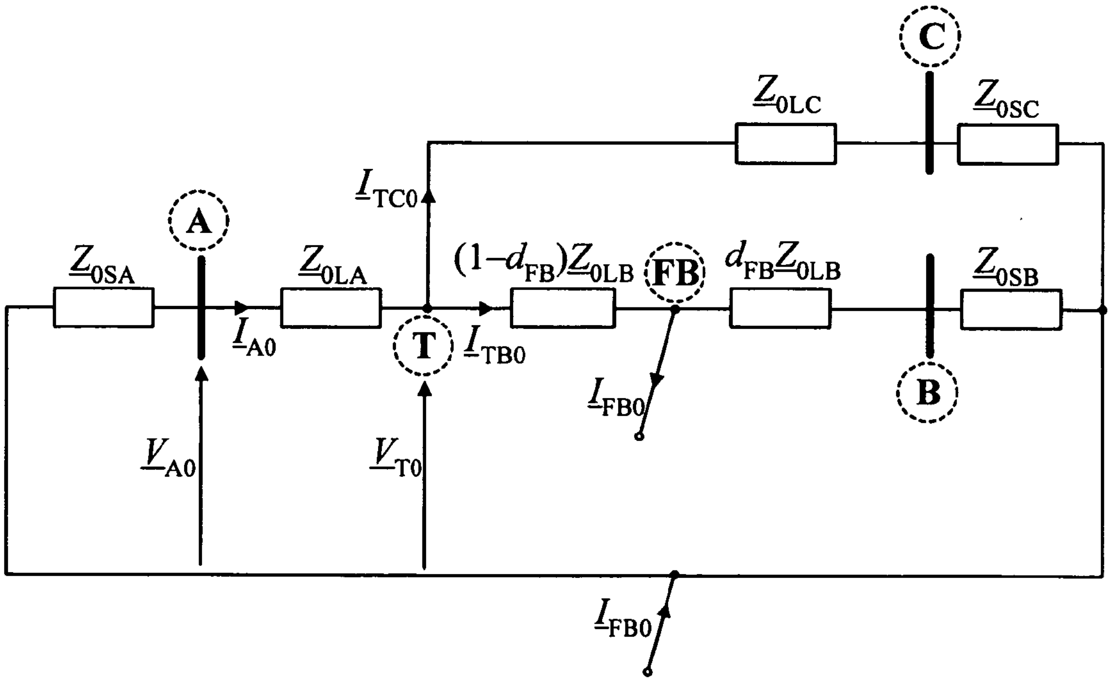
FIG. 6 illustrates an equivalent circuit diagram of the network for faults in the section BT, for the zero sequence.

For example, FIG. 4 may result in:

$$\Delta \underline{I}_{TB1} = \Delta \underline{I}_{A1} - \frac{\Delta \underline{V}_{A1} - \underline{Z}_{1LA}\Delta \underline{I}_{A1}}{(\underline{Z}_{1LC} + \underline{Z}_{1SC})} \tag{10}$$

Analogously, one obtains for the other symmetrical components:

$$\underline{I}_{TB2} = \underline{I}_{A2} - \frac{\underline{V}_{A2} - \underline{Z}_{1LA}\underline{I}_{A2}}{(\underline{Z}_{1LC} + \underline{Z}_{1SC})} \tag{11}$$

$$\underline{I}_{TB0} = \underline{I}_{A0} - \frac{\underline{V}_{A0} - \underline{Z}_{0LA}\underline{I}_{A0}}{(\underline{Z}_{0LC} + \underline{Z}_{0SC})} \tag{12}$$

In fact, in order to assure proper accuracy of fault location, the transferring of fault loop signals (8)-(9) has to be done with using the distributed parameter line model, see FIG. 4 showing an equivalent circuit diagram of the network for faults in the section BT, for the incremental positive sequence.

The pre-fault positive sequence current $\underline{I}_{TB1}^{pre}$ at the transfer point (8) can be determined with use of the measured current $\underline{I}_{A1}^{pre}$ and amplitudes of currents from the buses B, C: $|\underline{I}_{B1}^{pre}|$, $|\underline{I}_{C1}^{pre}|$, which are considered as the input data of the fault locator (FIG. 1). From FIG. 1 results:

$$\underline{I}_{A1}^{pre} - \underline{I}_{TB1}^{pre} - \underline{I}_{TC1}^{pre} = 0 \tag{13}$$

Resolving (13) into the real and imaginary parts yields:

$$\text{real}(\underline{I}_{A1}^{pre}) - \text{real}(\underline{I}_{TB1}^{pre}) - \text{real}(\underline{I}_{TC1}^{pre}) = 0 \tag{14}$$

$$\text{imag}(\underline{I}_{A1}^{pre}) - \text{imag}(\underline{I}_{TB1}^{pre}) - \text{imag}(\underline{I}_{TC1}^{pre}) = 0 \tag{15}$$

The extra two relations involving the pre-fault amplitudes of currents from the buses B and C can be written down as:

$$[\text{real}(\underline{I}_{B1}^{pre})]^2 + [\text{imag}(\underline{I}_{B1}^{pre})]^2 = |\underline{I}_{B1}^{pre}|^2 \tag{16}$$

$$[\text{real}(\underline{I}_{C1}^{pre})]^2 + [\text{imag}(\underline{I}_{C1}^{pre})]^2 = |\underline{I}_{C1}^{pre}|^2 \tag{17}$$

Since shunt capacitances of the line are here neglected, then the pre-fault currents at both ends of each section are identical and therefore in (16)-(17) the subscripts: B1, C1 can be changed to: TB1, TC1, i.e. as in (14)-(15)

Finally, one obtains the set of 4 equations: (14)-(17) in four unknowns: real($\underline{I}_{TB1}^{pre}$), imag($\underline{I}_{TB1}^{pre}$), real($\underline{I}_{TC1}^{pre}$), imag($\underline{I}_{TC1}^{pre}$), which after solving gives the required pre-fault phasors of currents from the remote terminals B and C.

Figure 3:
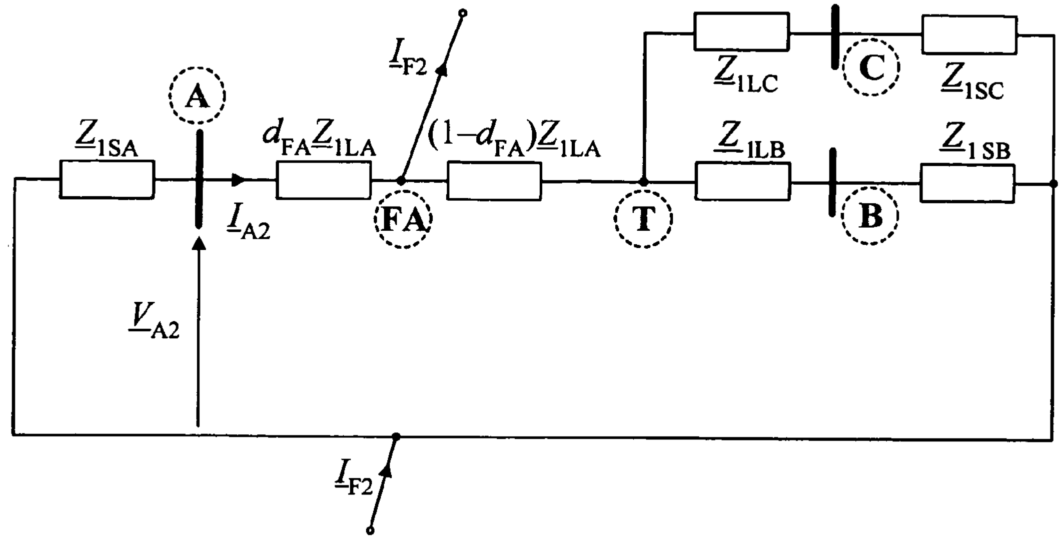
FIG. 3 illustrates an equivalent circuit diagram of the network for faults in the section AT, for the negative sequence.

The fault current distribution factor for the positive (negative) sequence can be obtained analysis of the flow of currents in the circuit diagram from FIG. 3:

$$\underline{k}_{FB1} = \underline{k}_{FB2} = \frac{\underline{K}_{B1} d_{FB} + \underline{L}_{B1}}{\underline{M}_{B1}} \tag{18}$$

where:

$$\underline{K}_{B1} = \underline{Z}_{1LB}$$

$$\underline{L}_{B1} = \underline{Z}_{1SB}$$

$$\underline{M}_{B1} = \frac{(\underline{Z}_{1LA} + \underline{Z}_{1SA})(\underline{Z}_{1LC} + \underline{Z}_{1SC})}{\underline{Z}_{1LA} + \underline{Z}_{1SA} + \underline{Z}_{1LC} + \underline{Z}_{1SC}} + \underline{Z}_{1LB} + \underline{Z}_{1SB}$$

Substitution of the fault current distribution factors (18) into the general fault model (6) results in the quadratic formula for complex numbers, analogously as for the case of faults occurring in the section AT (5). Its solution is also straightforward.

Subroutine: SUB_C

Figure 7:
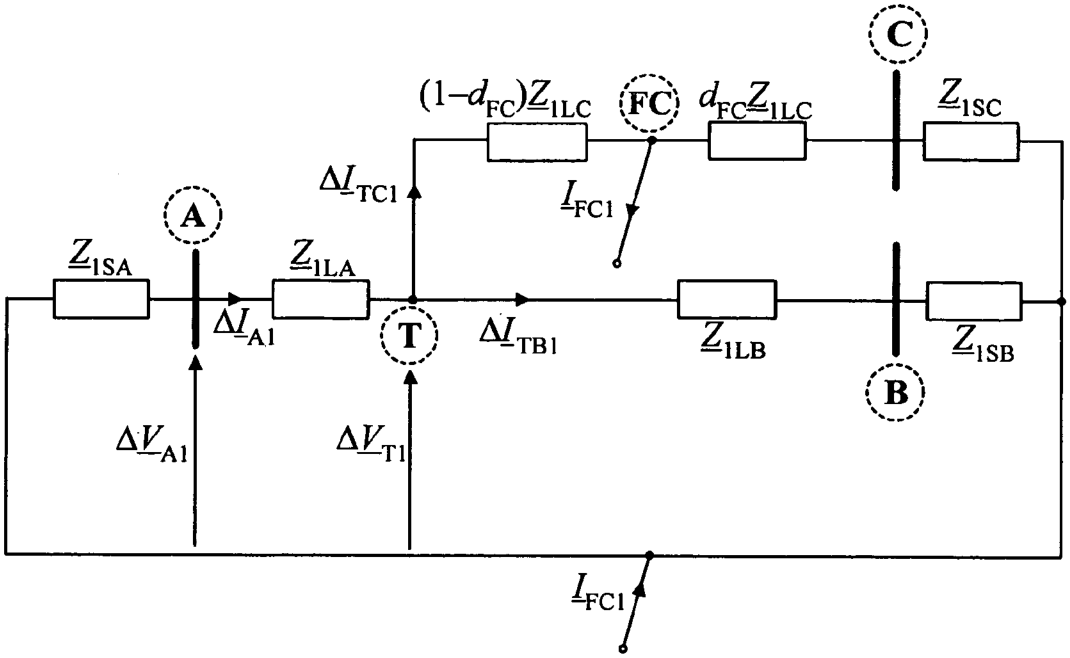
FIG. 7 equivalent circuit diagram of the network for faults in the section CT, for the incremental positive sequence.
Figure 8:
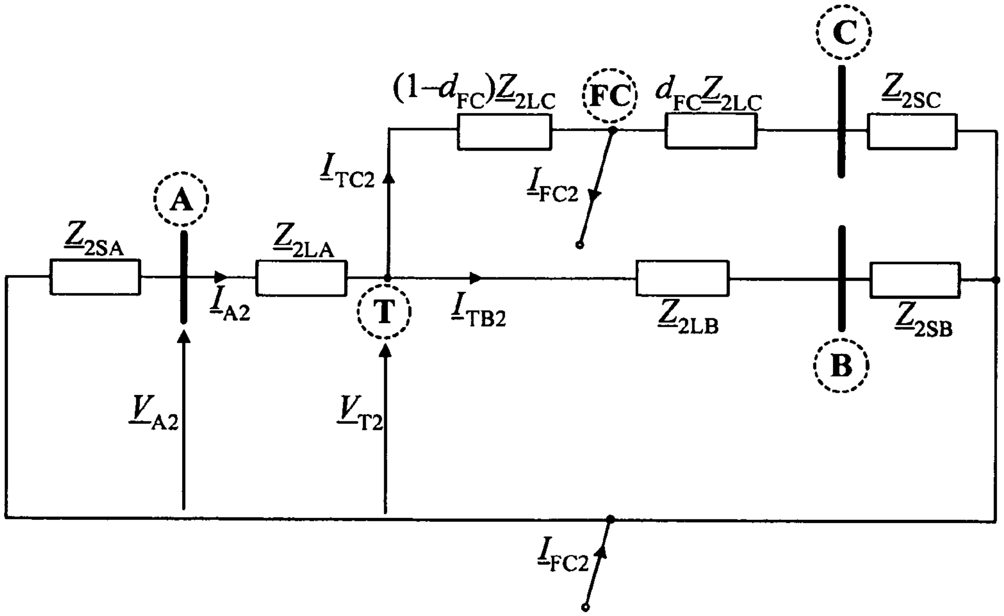
FIG. 8 illustrates an equivalent circuit diagram of the network for faults in the section CT, for the negative sequence.
Figure 9:
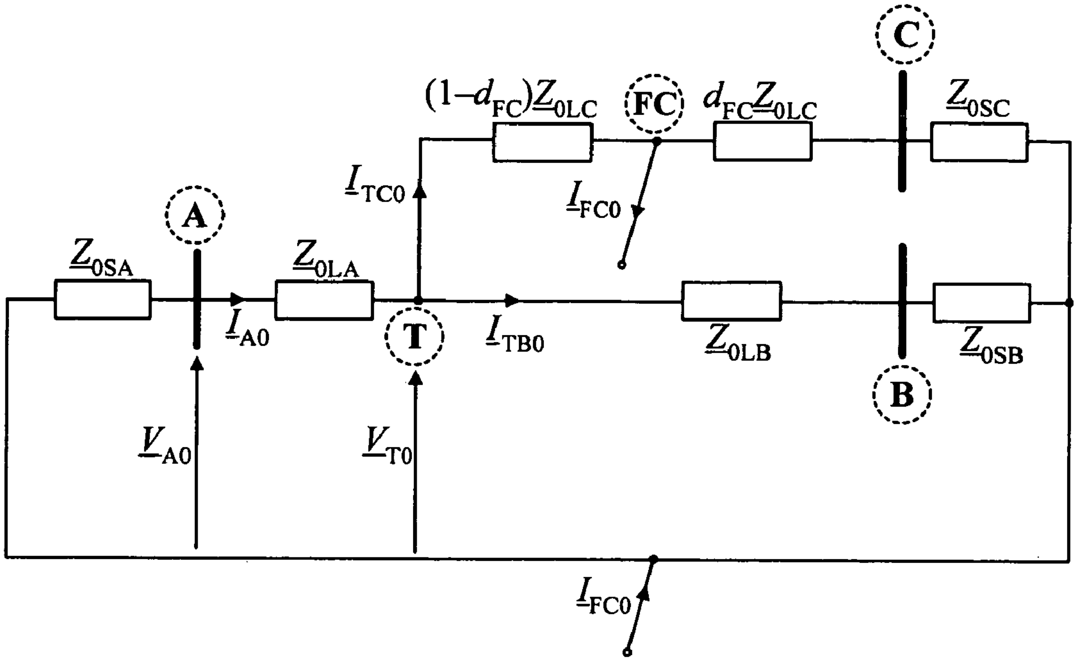
FIG. 9 illustrates an equivalent circuit diagram of the network for faults in the section CT, for the zero sequence.

Formulation of the remaining subroutine SUB_C can be performed analogously as it was presented for the subroutine SUB_B. For this purpose the equivalent circuit diagrams as in FIGS. 7, 8, 9 are considered.

Selection Procedure

The final step in the fault location algorithm relies on selecting the valid subroutine, i.e. on indicating which the subroutine yields the results corresponding to the real distance to fault and fault resistance.

The subroutine, which yields distance to fault outside its line section, and/or negative fault resistance, is surely false and has to be rejected. If this is not so, the other criteria have to be considered. In the carried out study the following criteria quantities were utilized:

- total fault currents in faulted phases (ought correspond to the measured currents),
- amplitudes of tbtal fault current in healthy phases (ought to be close to zero).

Embodiments of the present invention also include a computer program product that includes a computer readable medium and computer program instructions recorded on the computer readable medium and executable by a processor for performing the steps of the method described herein.

It is noted that while the above disclosure describes and exemplifying embodiments of the invention, there are several variations and modifications which may be made to the disclosed solution without departing from the scope of the present invention as defined in the appended claims.

We claim:

1. A method for locating a fault in a network including a three terminal power line, having three line sections located in front of or behind a tap point and a fault locating unit arranged at a first of the three terminals in a first of the three sections, wherein the fault occurs in at least one of the three sections, the method comprising:

measuring three phase currents and voltages at the first terminal in the first section;

measuring, before the fault occurs, amplitudes of load currents in a second section and a third section of the three sections;

storing the measured amplitudes of load currents in the fault locating unit;

calculating pre-fault phasors of currents in the second section and the third section from the measured amplitudes of load currents;

determining impedance data of the network; and determining a location of the fault by determining a distance to the fault based upon the measured three phase currents and voltages, the pre-fault phasors of currents and the impedance data of the network using a symmetrical components approach.

2. The method according to claim 1, further comprising:

using subroutines (Sub_A, Sub_B and Sub_C) for calculating the fault location.

3. The method according to claim 1, further comprising:

using a subroutine (Sub_A) for resolving $d_{FA}$—the distance to fault, counted from the bus A, and RFA—the fault resistance.

4. The method according to claim 1, further comprising: using the equation:

$$\underline{A}_2 d_{FA}^2 + \underline{A}_1 d_{FA} + \underline{A}_0 + \underline{A}_{00} R_{FA} = 0 \quad (5)$$

where:

$$\underline{A}_2 = \underline{Z}_{1LA}\underline{K}_{A1}$$

$$\underline{A}_1 = \underline{Z}_{1LA}\underline{L}_{A1} - \underline{Z}_{Ap}\underline{K}_{A1}$$

$$\underline{A}_0 = -\underline{Z}_{Ap}\underline{L}_{A1}$$

$$\underline{A}_{00} = \frac{\underline{M}_{A1}(\underline{\alpha}_{F1}\Delta\underline{I}_{A1} + \underline{\alpha}_{F2}\underline{I}_{A2})}{\underline{I}_{Ap}}$$

$$\underline{Z}_{Ap} = \frac{\underline{V}_{Ap}}{\underline{I}_{Ap}} \text{ - apparent impedance of the fault loop.}$$

5. The method according to claim 1, further comprising: using a subroutine (Sub_B) for identifying faults in a another section (BT).

6. The method according to claim 1, further comprising: using the equation:

$$\underline{V}_{Tp} - (1 - d_{FB})\underline{Z}_{1LB}\underline{I}_{TBp} - R_{FB}\left(\frac{\underline{\alpha}_{F1}\Delta\underline{I}_{TB1}}{\underline{k}_{FB1}} + \frac{\underline{\alpha}_{F2}\underline{I}_{TB2}}{\underline{k}_{FB2}}\right) = 0 \quad (6)$$

where:

Fault loop voltage transferred to the tap point T:

$$\underline{V}_{Tp} = \underline{a}_1\underline{V}_{T1} + \underline{a}_2\underline{V}_{T2} + \underline{a}_0\underline{V}_{T0} \quad (7)$$

fault loop current transferred to the tap point T (from the side of the section BT—FIG. 1):

$$\underline{I}_{TBp} = \underline{a}_1(\Delta\underline{I}_{TB1} + \underline{I}_{TB1}^{pre}) + \underline{a}_2\underline{I}_{TB2} + \underline{a}_0\frac{\underline{Z}_{0LB}}{\underline{Z}_{1LB}}\underline{I}_{TB0} \quad (8)$$

$\underline{a}_1$, $\underline{a}_2$, $\underline{a}_0$—weighting coefficients (Table I)), $\underline{k}_{FB1}$, $\underline{k}_{FB2}$—fault current distribution factors for the positive, negative sequences, respectively, $\underline{a}_{F1}$, $\underline{a}_{F2}$, $\underline{a}_{F0}$—share coefficients (Table II).

transfer of the fault loop voltage from the bus A to the tap point T can be accomplished as follows:

$$\begin{bmatrix} \underline{V}_{T1} \\ \underline{V}_{T2} \\ \underline{V}_{T0} \end{bmatrix} = \begin{bmatrix} \underline{V}_{A1} \\ \underline{V}_{A2} \\ \underline{V}_{A0} \end{bmatrix} - \begin{bmatrix} \underline{Z}_{1LA}\underline{I}_{A1} \\ \underline{Z}_{1LA}\underline{I}_{A2} \\ \underline{Z}_{0LA}\underline{I}_{A0} \end{bmatrix}. \quad (9)$$

7. The method according to claim 1, further comprising: using a set of equations (14-17) for solving unknowns: real($I_{TB1}^{pre}$), imag($I_{TB1}^{pre}$), real($I_{TC1}^{pre}$), imag($I_{TC1}^{pre}$), when solving gives the required pre-fault phasors of currents from the remote terminals (B,C).

8. The method according to claim 1, further comprising: substituting the fault current distribution factors (18) into a general fault model (6) resulting in a quadratic formula for complex numbers, analogously as for the case of faults occurring in the section AT (5).

9. The method according to claim 1, further comprising: selecting the valid subroutine, by indicating which subroutine yields the results corresponding to the real distance to fault and fault resistance.

10. A device for locating a fault in a network including a three terminal power lines system, having three line sections located in front of or behind a tap point and a fault locating unit arranged at a first of the three terminals in a first of the three sections, wherein the fault occurs in at least one of the three sections, the device comprising:

means for measuring current and voltages at the first terminal in the first section;

means for measuring, before a fault occurs, amplitudes of load currents in a second section and a third section of the three sections;

storage means configured to store the measured amplitudes of load currents in the fault locating unit;

means for calculating pre-fault phasors of currents in the second section and the third section from the measured amplitudes of load currents;

means for determining impedance data of the network; and means for determining a location of the fault by determining a distance to the fault based upon the measured three phase currents and voltages, the pre-fault phasors of currents and the impedance data of the network using a symmetrical components approach.

11. The device according to claim 10, further comprising: means for using subroutines (Sub_A, Sub_B and Sub_C) for calculating the fault location.

12. The device according to claim 10, further comprising: means for execute a subroutine (Sub_A) for resolving $d_{FA}$—the distance to fault, counted from the bus A, and RFA—the fault resistance.

13. The device according to claim 10, further comprising: means for calculating:

$$\underline{A}_2 d_{FA}^2 + \underline{A}_1 d_{FA} + \underline{A}_0 + \underline{A}_{00} R_{FA} = 0 \quad (5)$$

where:

$$\underline{A}_2 = \underline{Z}_{1LA}\underline{K}_{A1}$$

$$\underline{A}_1 = \underline{Z}_{1LA}\underline{L}_{A1} - \underline{Z}_{Ap}\underline{K}_{A1}$$

$$\underline{A}_0 = -\underline{Z}_{Ap}\underline{L}_{A1}$$

$$\underline{A}_{00} = \frac{\underline{M}_{A1}(\underline{\alpha}_{F1}\Delta\underline{I}_{A1} + \underline{\alpha}_{F2}\underline{I}_{A2})}{\underline{I}_{Ap}}$$

$$\underline{Z}_{Ap} = \frac{\underline{V}_{Ap}}{\underline{I}_{Ap}} \text{ - apparent impedance of the fault loop.}$$

14. The device according to claim 10, further comprising: means for execute a subroutine (Sub_B) for identifying faults in a another section (BT).

15. The device according to claim 10, further comprising: means for executing the equation:

$$\underline{V}_{Tp} - (1 - d_{FB})\underline{Z}_{1LB}\underline{I}_{TBp} - R_{FB}\left(\frac{\underline{\alpha}_{F1}\Delta\underline{I}_{TB1}}{\underline{k}_{FB1}} + \frac{\underline{\alpha}_{F2}\underline{I}_{TB2}}{\underline{k}_{FB2}}\right) = 0 \quad (6)$$

where:

Fault loop voltage transferred to the tap point T:

$$\underline{V}_{Tp} = \underline{a}_1\underline{V}_{T1} + \underline{a}_2\underline{V}_{T2} + \underline{a}_0\underline{V}_{T0} \quad (7)$$

Fault loop current transferred to the tap point T (from the side of the section BT—FIG. 1):

$$I_{TBp}=\underline{a}_1(\Delta I_{TB1}+I_{TB1}^{pre})+\underline{a}_2 I_{TB2}+\underline{a}_0\frac{Z_{0LB}}{Z_{1LB}}I_{TB0} \quad (8)$$

$\underline{a}_1$, $\underline{a}_2$, $\underline{a}_0$—weighting coefficients (Table I)), $\underline{k}_{FB1}$, $\underline{k}_{FB2}$—fault current distribution factors for the positive, negative sequences, respectively, $\underline{a}_{F1}$, $\underline{a}_{F2}$, $\underline{a}_{F0}$—share coefficients (Table II).

Transfer of the fault loop voltage from the bus A to the tap point T can be accomplished as follows:

$$\begin{bmatrix} \underline{V}_{T1} \\ \underline{V}_{T2} \\ \underline{V}_{T0} \end{bmatrix} = \begin{bmatrix} \underline{V}_{A1} \\ \underline{V}_{A2} \\ \underline{V}_{A0} \end{bmatrix} - \begin{bmatrix} \underline{Z}_{1LA}\underline{I}_{A1} \\ \underline{Z}_{1LA}\underline{I}_{A2} \\ \underline{Z}_{0LA}\underline{I}_{A0} \end{bmatrix}. \quad (9)$$

16. The device according to claim 10, further comprising:

means for using a set of equations (14-17) for solving unknowns: real($I_{TB1}^{pre}$), imag($I_{TB1}^{pre}$), real($I_{TC1}^{pre}$), imag($I_{TC1}^{pre}$), when solving gives the required pre-fault phasors of currents from the remote terminals (B,C).

17. The device according to claim 10, further comprising:

means for substituting the fault current distribution factors (18) into a general fault model (6) resulting in a quadratic formula for complex numbers, analogously as for the case of faults occurring in the section AT (5).

18. The device according to claim 10, further comprising:

means for selecting the valid subroutine, by indicating which subroutine yields the results corresponding to the real distance to fault and fault resistance.

19. A computer program product, comprising:

a computer readable medium; and computer program instructions recorded on the computer readable medium and executable by a processor for performing the steps of a method for locating a fault in a network including a three terminal power line, having three line sections located in front of or behind a tap point and a fault locating unit arranged at a first of the three terminals in a first of the three sections, wherein the fault occurs in at least one of the three sections, the method comprising:

measuring three phase currents and voltages at the first terminal in the first section;

measuring, before the fault occurs, amplitudes of load currents in a second section and a third section of the three sections;

storing the measured amplitudes of load currents in the fault locating unit;

calculating pre-fault phasors of currents in the second section and the third section from the measured amplitudes of load currents;

determining impedance data of the network; and determining a location of the fault by determining a distance to the fault based upon the measured three phase currents and voltages, the pre-fault phasors of currents and the impedance data of the network using a symmetrical components approach.

20. The computer program product according to claim 19, wherein the computer program instructions are further for performing the step of at least partially providing the computer program instructions through a network.

21. The computer program product according to claim 20, wherein the network is the internet.

* * * * *